(12) United States Patent  
Chang et al.

(10) Patent No.: US 9,595,440 B2
(45) Date of Patent: Mar. 14, 2017

(54) METHOD OF USING A VAPORIZING SPRAY SYSTEM TO PERFORM A TRIMMING PROCESS

(71) Applicant: Taiwan Semiconductor Manufacturing Company, Ltd., Hsin-Chu (TW)

(72) Inventors: Ching-Yu Chang, Yuansun Village (TW); Kuei-Liang Lu, Hsinchu (TW); Ming-Feng Shieh, Yongkang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 171 days.

(21) Appl. No.: 14/657,954

(22) Filed: Mar. 13, 2015

(65) Prior Publication Data

US 2015/0187564 A1    Jul. 2, 2015

Related U.S. Application Data

(63) Continuation-in-part of application No. 12/916,704, filed on Nov. 1, 2010, now abandoned.

(51) Int. Cl.
*H01L 21/027* (2006.01)
*H01L 21/033* (2006.01)
*H01L 21/311* (2006.01)
*H01L 21/02* (2006.01)
*G03F 7/16* (2006.01)
(Continued)

(52) U.S. Cl.
CPC ............ *H01L 21/0271* (2013.01); *G03F 7/11* (2013.01); *G03F 7/167* (2013.01); *H01L 21/0273* (2013.01); *H01L 21/02118* (2013.01); *H01L 21/02282* (2013.01); *H01L 21/0337* (2013.01); *H01L 21/0338* (2013.01); *H01L 21/31133* (2013.01); *H01L 21/6708* (2013.01)

(58) Field of Classification Search
None
See application file for complete search history.

(56) References Cited

U.S. PATENT DOCUMENTS 6,174,651 B1    1/2001   Thakur
7,247,575 B2    7/2007   Cheng et al.
(Continued)

OTHER PUBLICATIONS

Sun, et al., "Wet trimming process for critical dimension reduction", Advances in Resist Materials and Processing Technology XXV, Proc. of SPIE, (2008), 11 pgs., vol. 6923-692336.
(Continued)

*Primary Examiner* — Robert Bachner
*Assistant Examiner* — Molly Reida
(74) *Attorney, Agent, or Firm* — Haynes and Boone, LLP

(57) ABSTRACT

A method of semiconductor device fabrication including placing a substrate having a first and second features disposed thereon in a vaporizing spray deposition system. An atomizing spray head of the vaporizing spray deposition system is used to deposit a conformal polymer layer on the first and second features. The first feature having the layer of the polymer disposed thereon and having a first width. A spray trim process is performed on the first and second features having the polymer layer disposed thereon using the atomizing spray head.

20 Claims, 12 Drawing Sheets

(51) Int. Cl.
*G03F 7/11* (2006.01)
*H01L 21/67* (2006.01)

(56) References Cited

U.S. PATENT DOCUMENTS

| | | | |
|---|---|---|---|
| 8,394,723 B2* | 3/2013 | Valdivia | H01L 21/0273 |
| | | | 257/618 |
| 8,420,304 B2 | 4/2013 | Inatomi | |
| 2002/0119655 A1 | 8/2002 | Liu | |
| 2005/0233922 A1 | 10/2005 | Jung et al. | |
| 2009/0050271 A1* | 2/2009 | Goyal | H01L 21/0338 |
| | | | 156/345.25 |
| 2009/0274872 A1 | 11/2009 | Thallner | |
| 2009/0311424 A1* | 12/2009 | Kamijima | G03F 7/40 |
| | | | 427/228 |
| 2010/0099267 A1 | 4/2010 | Wang et al. | |
| 2011/0163420 A1* | 7/2011 | Valdivia | H01L 21/0273 |
| | | | 257/618 |

OTHER PUBLICATIONS

Mahoney, William et al., Mist Deposition of Thin Photoresist Films. 2004 Proceedings in SPIE vol. 5376, pp. 861-866.

* cited by examiner

METHOD OF USING A VAPORIZING SPRAY SYSTEM TO PERFORM A TRIMMING PROCESS

CROSS-REFERENCE TO RELATED APPLICATIONS

This application is a continuation-in-part application of U.S. application Ser. No. 12/916,704, which was filed on Nov. 1, 2010, the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs. For these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

However, there are challenges to implementing such smaller and smaller features and processes in semiconductor fabrication. For example, in the course of fabricating semiconductor devices, a one or more patterned hard mask features may be formed on the device. An etching process may be used to form the pattern features. Such etching process may cause sharp inside corners in the features, which may reduce device etching performance.

One may fill-in the sharp corners by adding a photoresist/conformal coating layer to the device. Traditionally the coating is added by dropping a large volume of liquid photoresist/conformal coating on the device and spinning the device wafer to spread the liquid coating. This process cannot be performed in a traditional CMOS processing chamber. In addition, this process forms an uneven coating, such as a thin coating in high step places and a thick coating in the low places, such as between raised features on the device. Thus, the spin-on coating process generally fails to achieve a uniform high-step coverage polymer thin film. Another problem found with conventional coating systems include having a high-temperature CVD deposition process where there may be contamination problems if the structure wafer is coated with a photoresist film. As should be understood, conventional spin-on coating systems can not achieve a substantially uniform polymer type thin film deposition on semiconductor device wafers.

Thus, an improved a system for thin film formation on a semiconductor device using a vaporizing polymer spray deposition system.

DETAILED DESCRIPTION

Figure 1:
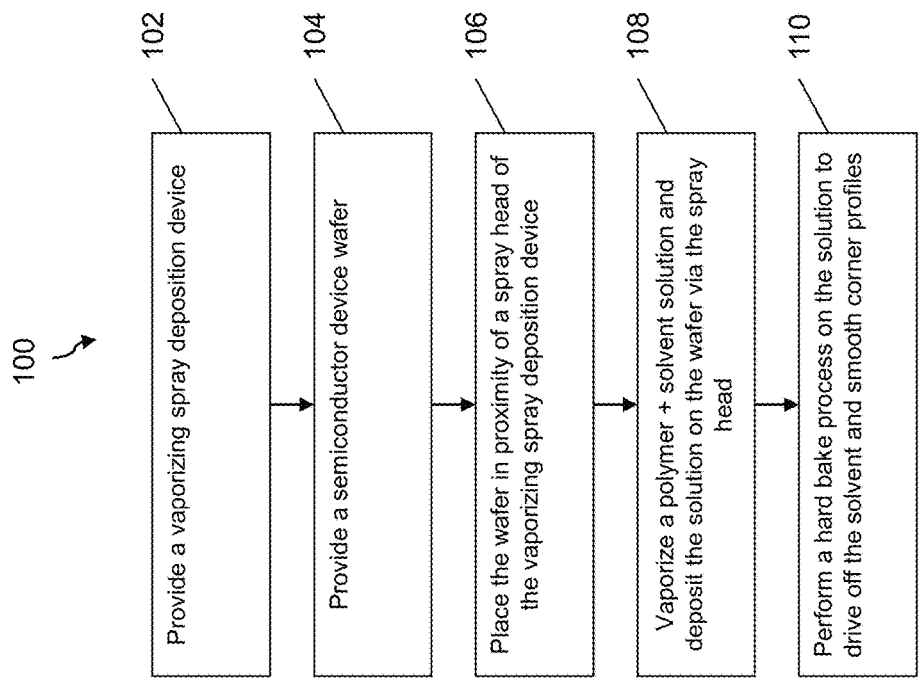
FIG. 1 is a flow chart of an embodiment of a method of forming a thin film layer on a wafer.

The present disclosure relates generally to semiconductor fabrication and more specifically to a vaporizing polymer spray deposition system and method for forming a thin film on a semiconductor device wafer. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

In contrast to conventional chemical-vapor deposition (CVD) and spin-on coating systems, the present disclosure provides systems to vaporize a polymer fluid and then deposit the vaporized fluid on semiconductor wafers. Using this system, a very thin and substantially uniform polymer film may be formed to cover substantially all of the coated side of the structure. In other words, embodiments of the present disclosure provide systems and methods for forming a substantially uniform thin film on topographical semiconductor devices/wafers using a vaporizing/atomizing spray deposition system. Essentially, embodiments of the present disclosure use vaporized polymer fluids to spray on semiconductor wafers to form a uniform, thin polymer film, whereas conventional coating systems apply the coating as a large drop of the liquid and spin the device to spread the liquid.

As should be understood, a benefit of the vaporizing/atomizing spray deposition system is that it fills-in sharp internal corners on high-stepped, raised features, such as raised hard mask features, on the semiconductor wafer, which are not filled using the conventional systems. Another benefit includes resolving conventional problems known in the art with high-temperature thin film deposition on resisted wafers.

FIG. 1 illustrates a flow chart of an embodiment of a method 100 of forming a thin film layer on a wafer, such as a semiconductor device wafer 210. This method 100 is described herein with respect to the devices shown in FIGS. 2A-7. The method 100 begins at block 102 where a spray deposition device is provided.

Figure 2A:
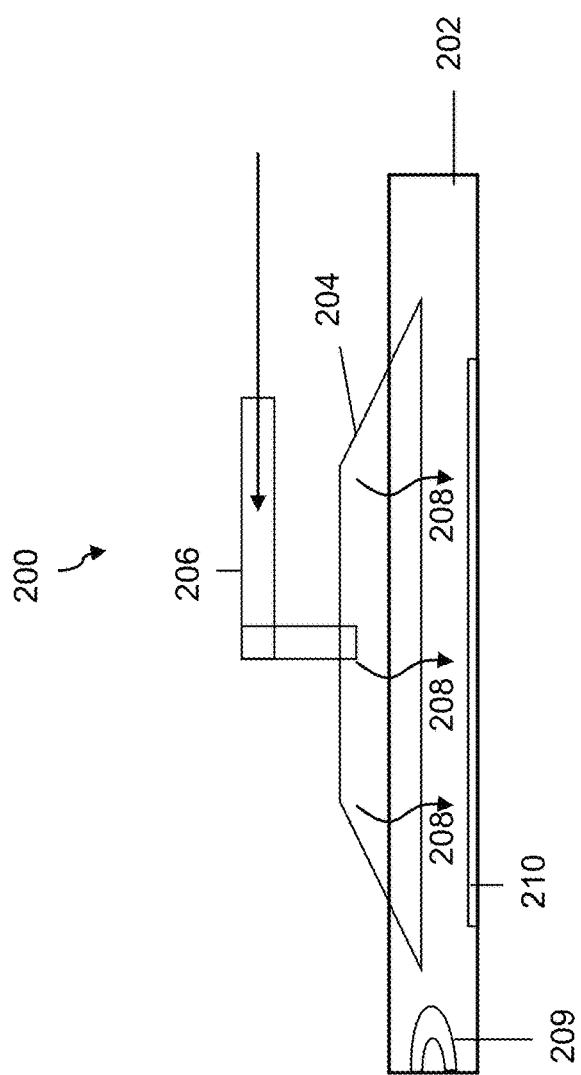
FIG. 2A illustrates a cross-sectional view of an embodiment of a vaporizing spray deposition device corresponding to steps of the method of FIG. 1.

FIG. 2A illustrates a cross-sectional view of an embodiment of a spray deposition device 200 configured to operate corresponding to steps of the method 100. In an embodiment, the spray deposition device 200 is a vaporizing spray deposition system that atomizes a conformal coating fluid, such as a polymer/solvent solution, over a surface, such as a semiconductor wafer 210, that is to be coated. The spray device 200 includes a process chamber 202, a spray head 204, and a fluid line 206. In an embodiment, the process chamber 202 includes a heating device 209.

The process chamber 202, in one embodiment, is a closed-bottom container having a base and sidewalls extending upward from base toward the spray head around a perimeter of the base. Thus, the process chamber 202 is configured to hold and support one or more semiconductor devices/wafers and to catch a portion of the fluid overspray from the spray head 204. The process chamber 202 may be formed from a material substantially impervious to the polymer and solvent mixture vaporized by the spray head 204. In an alternative embodiment, the process chamber 202 may be a processing chamber typical of one or more CMOS processes.

The spray head 204 receives the fluid to be vaporized via the fluid line 206. The fluid line receives the transmitted fluid from a holding tank (not shown). In an embodiment, the fluid is supplied to the spray head heated and/or under pressure, thereby allowing the spray head 204 to receive the fluid mixture, vaporize/atomize the fluid, and emit the vaporized fluid toward the target surface in the process chamber 202. Both the spray head 204 and the fluid line 206 may be formed from a material substantially impervious to the polymer and solvent mixture vaporized by the spray head 204.

Figure 2B:
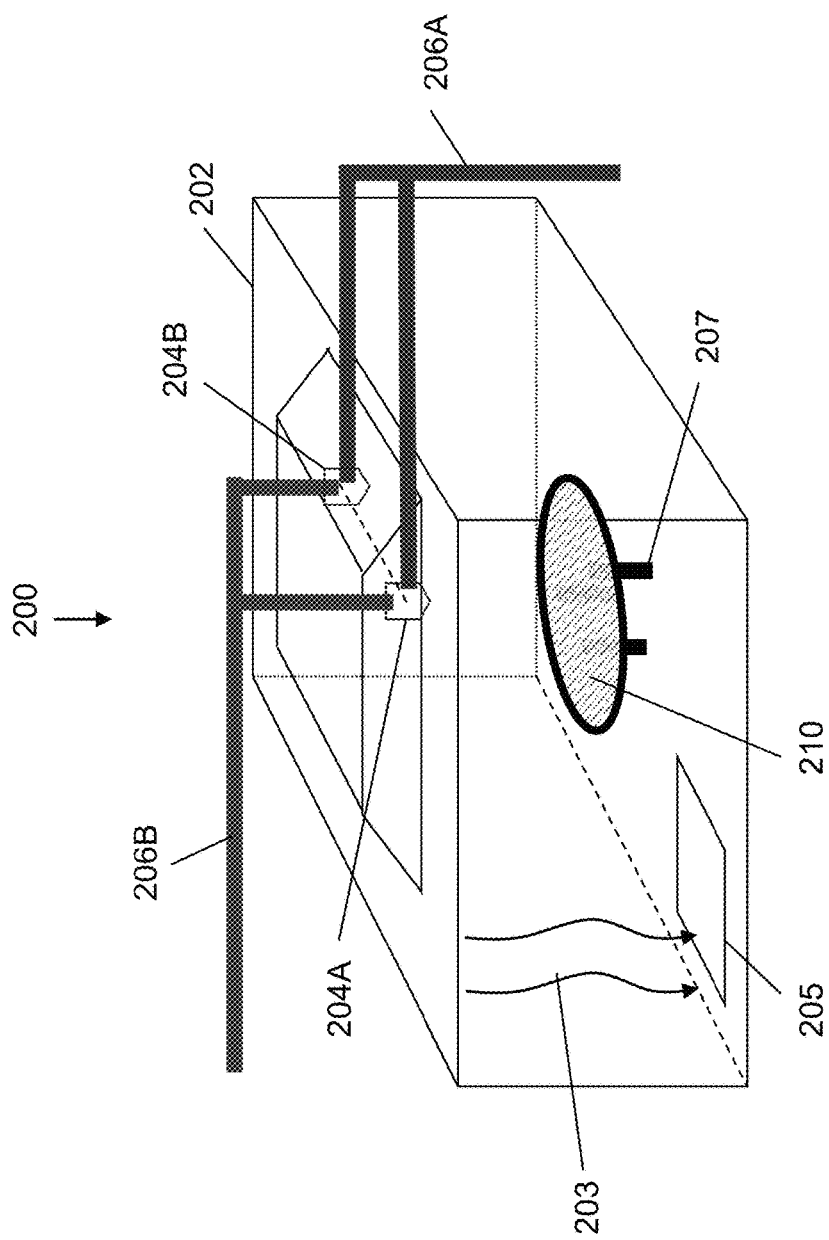
FIG. 2B illustrates a perspective view of an embodiment of a vaporizing spray deposition device corresponding to steps of the method of FIG. 1.

FIG. 2B illustrates a perspective view of another embodiment of a vaporizing spray deposition device 200 corresponding to steps of the method of FIG. 1. This embodiment includes a process chamber 202, a plurality of spray heads 204A and 204B, and a plurality of fluid lines 206A and 206B, which respectively provide polymer/solvent solution and high pressure $N_2$/air to the spray heads 204A and 204B. The pressure of the $N_2$/air may be varied to aid in the vaporization of the fluid mixture. The process chamber 202 may include a fan, blower or other device (not shown) to provide a down flow of air or other gas 203 (e.g., $N_2$) in the chamber 202 and out an exhaust vent 205 to aid in the spray process 100. The process chamber 202 also includes a wafer holder 207 for holding the wafer 210 firmly in the process chamber 202.

Figure 3:
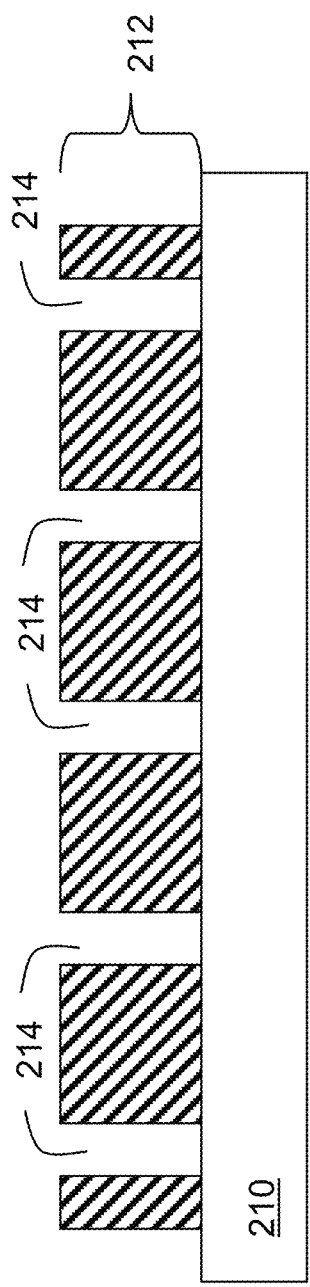
FIG. 3 illustrates a cross-sectional view of an embodiment of a semiconductor wafer and a hard mask layer having various raised features.

The method 100 then proceeds to block 104 where a semiconductor device wafer 210 is provided. The method 100 forms a thin coating on any surface, however a semiconductor device wafer 210 is discussed in this example. FIG. 3 illustrates a cross-sectional view of an embodiment of a semiconductor wafer having a hard mask layer 212, that is patterned to have various raised features therein. Though described herein as a hard mask layer 212, the method 100 is applicable to forming a polymer layer on any portion of a substrate, including any patterned layer. The hard mask features 212 have open cavities 214 between the features 212. Because of the very small dimensions involved in the pattern, the etching process that is used to pattern the hard mask layer 212 may form small, sharp interior corners between various features 212, when viewed in a top view (not shown here, see FIG. 6, discussed below). In an embodiment, the wafer 210 includes one or more layers (e.g., underlying layer 212) of Si, $SiO_2$, polysilicon, dielectric, and/or other materials to be etched. In an embodiment, the hard mask layer 212 includes SiO2, SiN, SiON, and/or other suitable materials. In another embodiment, the wafer layer 210 may include a second layer of hard mask, such as SiO2, SiN, SiON, TiN, and/or other hard mask materials, wherein both layers are formed on other semiconductor device layers (not shown). If both layers are hard mask layers, they may be formed of different materials to provide etching selectivity for use of the hard mask 212. In alternative embodiments, the wafer 210 may include semiconductor features, such as a source, a drain, a gate, an isolation feature, and other semiconductor features. In other words, the wafer 210 may include any layer or material that is to be etched using a patterned layer, such as the hard mask layer 212, as a pattern for the etching process.

Figure 4:
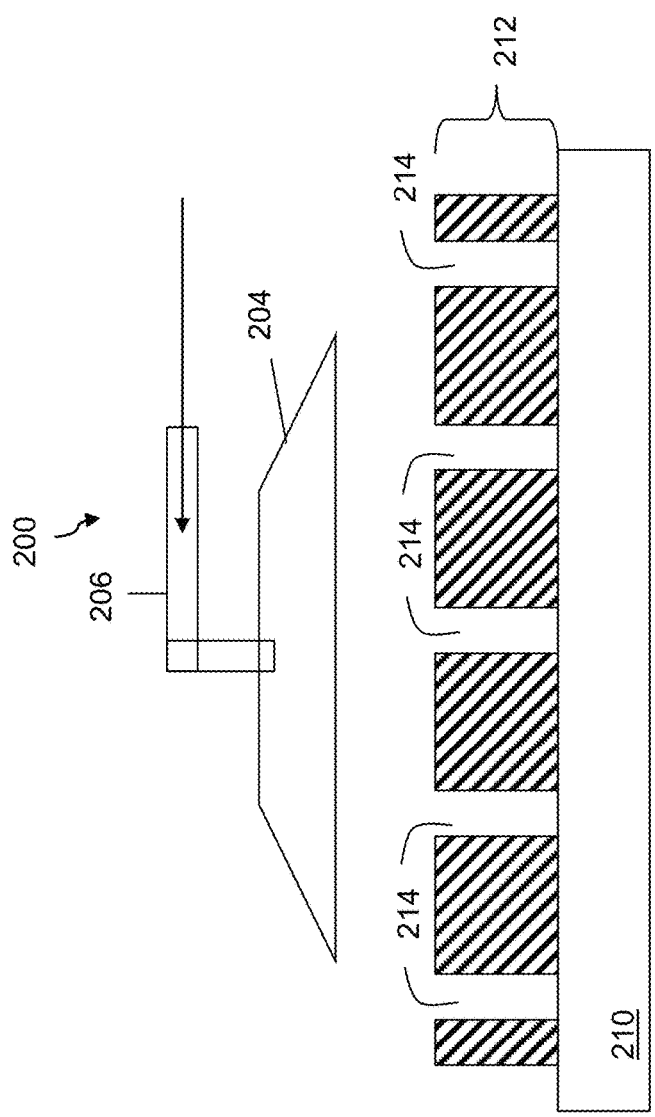
FIGS. 4 and 5 are cross-sectional views of an embodiment of the vaporizing spray deposition device of FIG. 2 and an embodiment of the semiconductor wafer hard mask layers of FIG. 3 at different stages of forming a thin polymer film thereon.

The method 100 proceeds next to block 106 where the wafer 210 is placed in proximity of the spray head 204, such as in the process chamber 202. FIG. 4 is a cross-sectional view of the wafer 210 placed in the proximity of the vaporizing spray deposition device 200.

Figure 5:
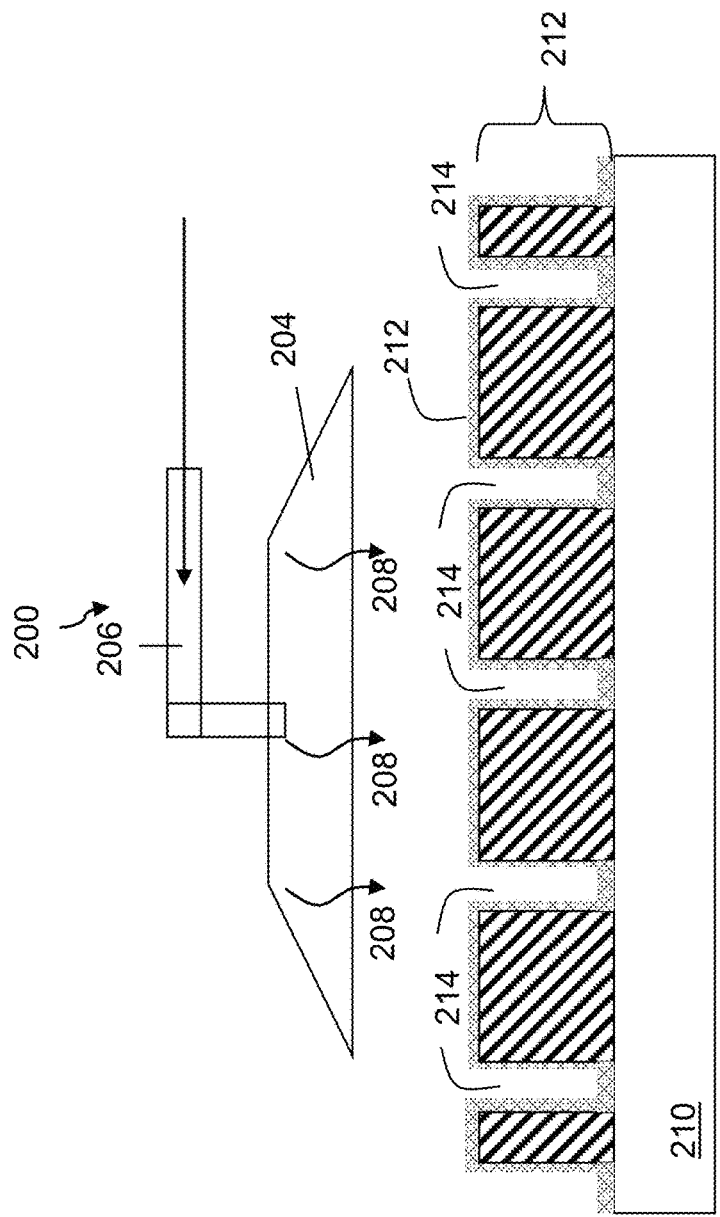

After the wafer 210 is placed in proximity of the spray head 204, the method 100 proceeds to block 108 where the spray head 204 receives the polymer/solvent mixture, vaporizes the mixture, and sprays/emits the vaporized mixture 208 toward the wafer 210 to form a thin film layer 220 on the wafer 210 (See FIG. 5). Using the polymer vapor 208 causes the thin film 220 to be formed to a substantially uniform thickness on the hard mask features 212, along the sidewalls of the cavities 214 and on the wafer 210 in the cavities 214. For example, the thin film layer 220 may be formed to have a height of less than 100 Angstrom. However, other heights of thin film 220 may be formed. In an embodiment, the diluted polymer/solvent solution may be a resist solvent. Exemplary compositions of the solvent solution include propylene glycol monomethyl ether (PEMG), Propylene glycol monomethyl ether acetate (PEMGA), cyclohexanol, ethyl lactate, and combinations thereof. The system may have a photo resist viscosity centipoises (cp) range from approximately 0.5 cp to approximately 2.5 cp. Here 1 cp=1 m Pa·s=0.001 (kg·m$^{-1}$·s$^{-1}$). In one embodiment, the polymer to solvent ratio is 0.1% to 10%.

The vaporizing spray deposition device 200 may have a deposition rate range of approximately 1 Angstrom per second to approximately 5 Angstrom per second. However, other deposition rates may be used. In an embodiment, the spray head 204 may vaporize the polymer/solvent fluid to have a droplet size range less than approximately 25 micrometers. After the deposition of the polymer layer 220, an optional solvent spray trim process may be performed on the polymer layer 220 to decrease the thickness of the polymer layer 220 at one or more regions. The further details of spray trim processes are detailed with reference to FIGS. 8, 9 and 10 below.

Figure 6:
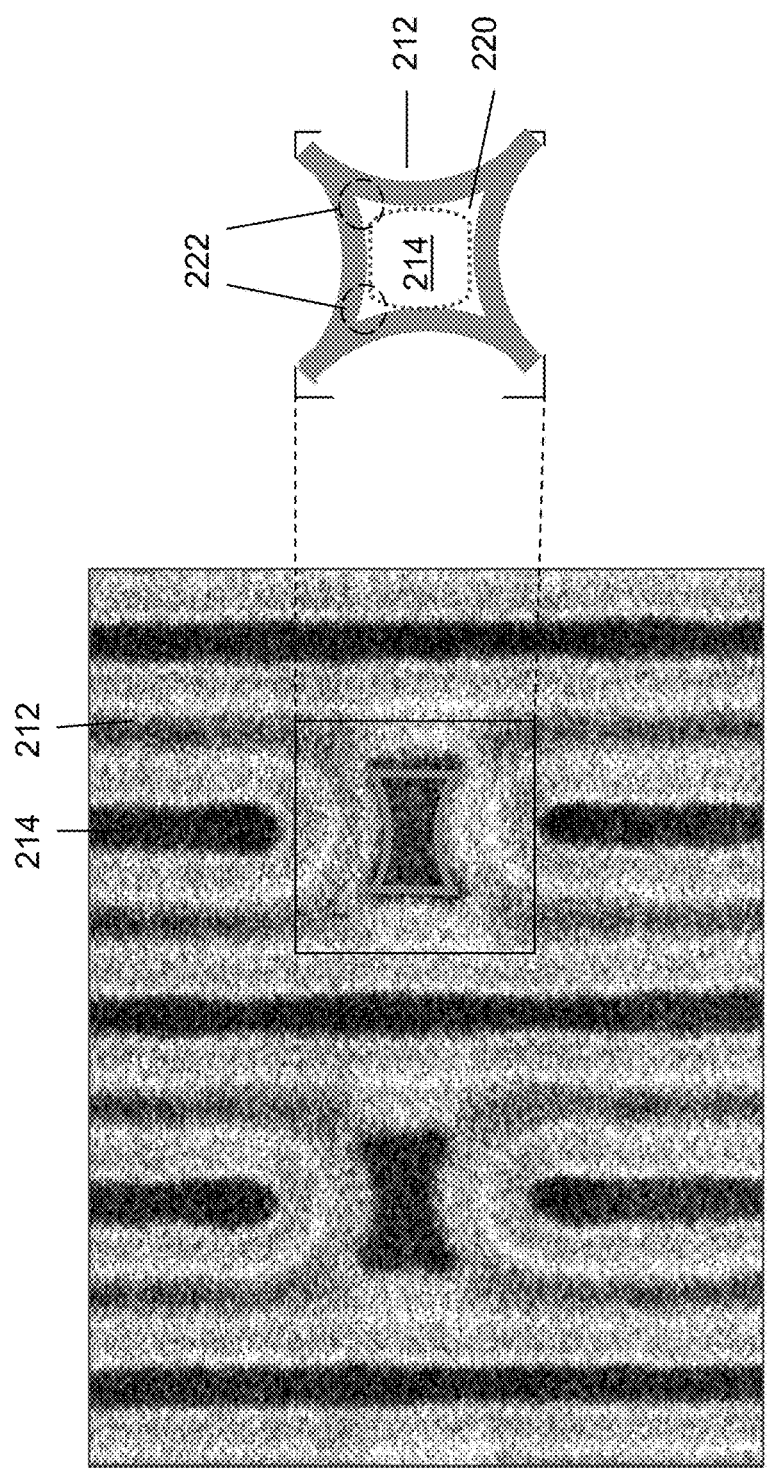
FIGS. 6 and 7 are top views of different embodiments of hard mask features and cavities therein having sharp corners in the features filled-in with a thin film coating layer.
Figure 7:
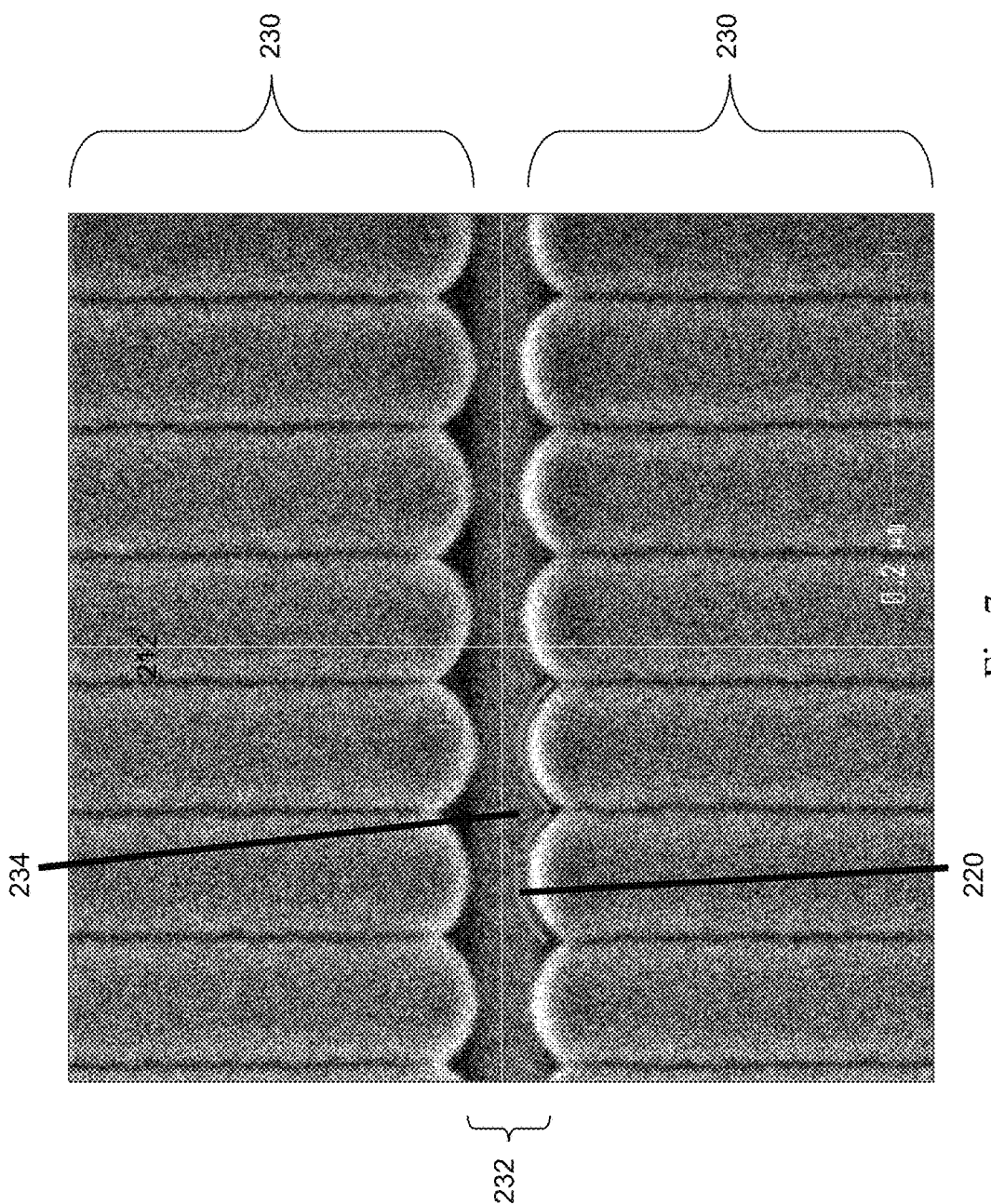

In an embodiment, the fluid is a polymer/solvent mixture. Thus, as the solvent evaporates, what remains is the layer of the polymer 220 on the wafer 210. Evaporation of the solvent may occur naturally when exposed to the atmosphere. In addition, a heating process may be performed on the polymer 220 to accelerate the evaporation of the solvent. Accordingly, the method 100 may proceed to block 110 where a hard bake process is performed on the polymer 220 to drive off the solvent. In addition, the hard bake process allows the polymer layer 220 to smooth out, thereby filling in the sharp interior angles between the features hard mask features 212, as shown in FIGS. 6 and 7. The hard bake process may be performed using the heating element 209 in the process chamber 202. In another embodiment, the hard bake process may be performed in a separate heating chamber. In an embodiment, the hard bake process may be performed at a temperature range of approximately 100 C to approximately 200 C. A specific example performs the hard bake process at a temperature range of approximately 130 C to approximately 150 C. The hard bake heating process may be performed for a time period ranging from one second to approximately 60 seconds. For example, one hard bake process performs the hard bake for a time period of approximately 20 seconds. However, it should be understood that other temperatures and other times may be used for the systems and methods of the present disclosure.

FIGS. 6 and 7 are top views of different embodiments of hard mask features 212, 230 and cavities 214, 232 having sharp corners 222, 234, which are filled in with the polymer layer 220 and the hard bake process of the present disclosure.

As described above, the spray coated polymer film may be formed on any patterned feature on a semiconductor substrate. In an embodiment, a process for forming a thin film on a semiconductor device may include using a Multiple Edge Enabled Patterning (MEEP) process, which uses spacer patterning technology to get end-to-end spacer film patterns merged. The spacer patterning technique is referred to as a "pitch-halving" process, and is described in more detail in patent application Ser. No. 12/370,152, filed on Feb. 12, 2009, and was published on Aug. 12, 2010, U.S. Publication Number 2010/0203734A1, and is hereby incorporated by reference in its entirety. Thereafter, the spacer oxide film roof is opened, and a vaporized polymer fluid is spray coated to provide a very thin film on the spacer oxide film. Then, a hard bake process may be performed to the polymer film to fill tiny voids in feature interior corners. A bottom hard mask film may be etched to smooth out the interior corners. Other embodiments may use a low temperature and/or room temperature atomic layer deposition (ALD) tool to deposit an ALD-oxide or an ALD SiN film, and other embodiments may use a two mask patterning process.

Figure 8:
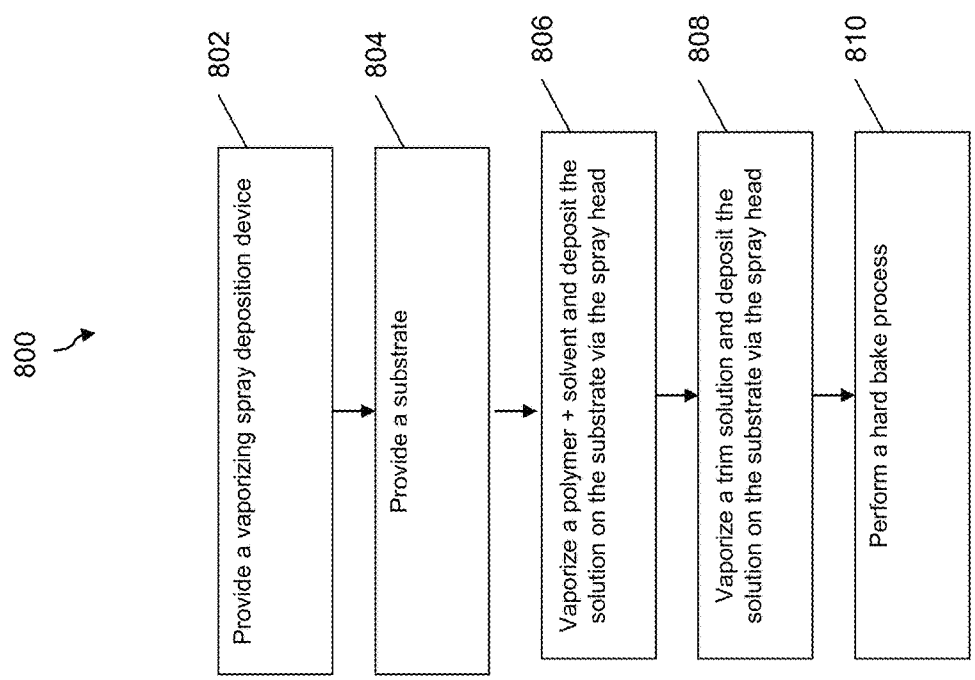
FIG. 8 is a flow chart of an embodiment of method of performing a trim process using a vapor spray apparatus.

Referring now to FIG. 8, illustrated is an embodiment of a method 800 which includes using an atomizing/spray deposition to form a thin polymer layer and/or perform a trim process. Exemplary embodiments of certain steps of the method 800 are presented in FIGS. 9-11.

The method 800 begins at block 802 where a spray deposition tool is provided. Referring to the example of FIG. 9, the spray deposition tool 200 is illustrated. The spray deposition tool may be substantially similar to the spray deposition tool described above with reference to FIG. 1 and/or FIGS. 2A and 2B. The spray device 200 includes a process chamber 202, a spray head 204 and at least one fluid line 206. In an embodiment, the process chamber 202 includes a heating device 209. These elements are described in further detail above.

The spray head 204 receives a fluid to be vaporized from the fluid line 206 as discussed above. In an embodiment, the fluid is supplied to the spray head heated and/or under pressure, thereby allowing the spray head 204 to receive the fluid mixture, vaporize/atomize the fluid, and emit the vaporized fluid toward the target surface in the process chamber 202. The vaporized fluid may be emitted through any number of nozzles.

Figure 9:
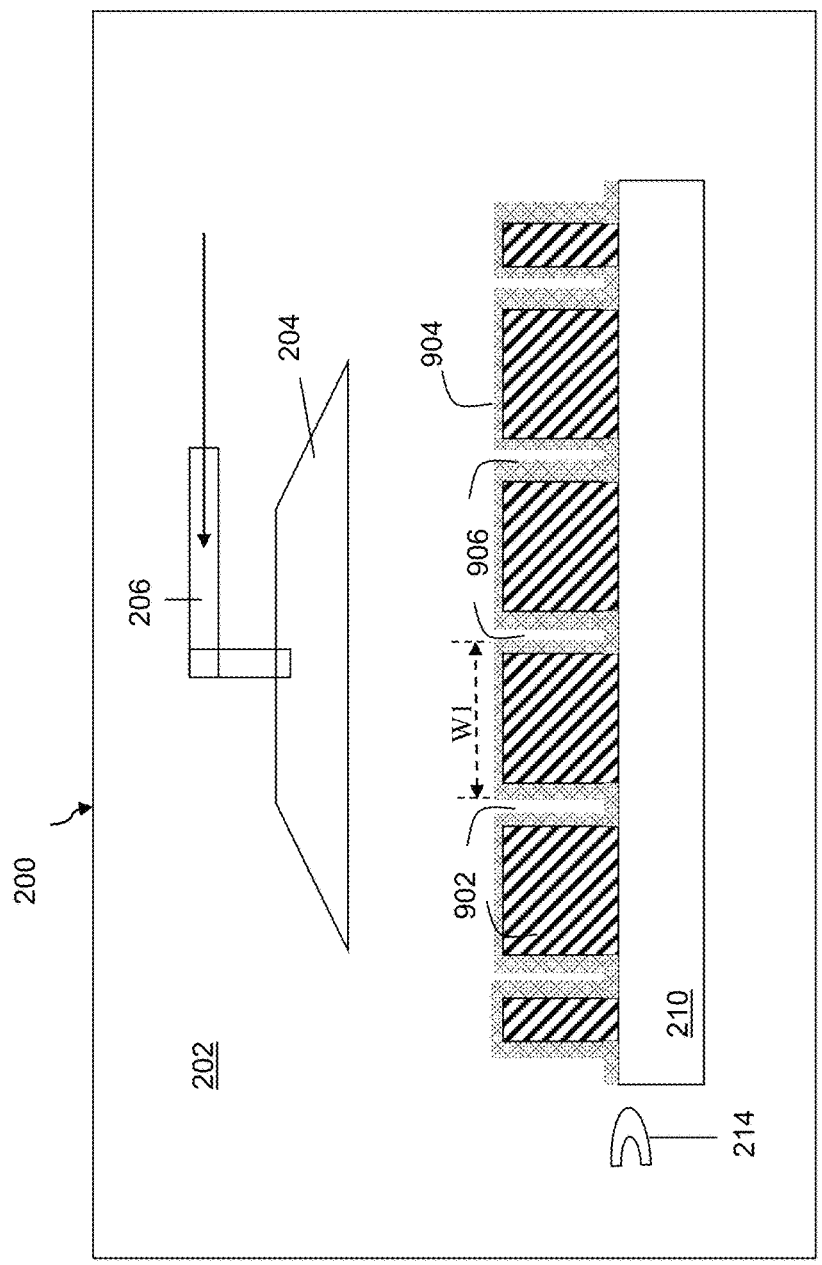
FIGS. 9 and 10 are cross-sectional views of an embodiment of the vaporizing spray deposition device of FIG. 2 and an embodiment of the semiconductor wafer at different stages of performing a trim process.

The method 800 then proceeds to block 804 where a semiconductor substrate is provided to the deposition tool. The semiconductor substrate may include any number of layers or features formed thereon including, insulating layers/regions, interconnect layers, gate features, active regions, and/or other typical features formed by semiconductor device fabrication methods. The exemplary FIG. 9 illustrates a semiconductor substrate 210. The semiconductor substrate 210 may be substantially similar to as discussed above.

As illustrated in FIG. 9, a plurality of features 902 is disposed on the substrate 210. The features 902 may be substantially similar to the features 212, discussed above with reference to FIGS. 1-7. Openings 906 interpose the features 902. The openings 906 may be substantially similar to the openings 214, discussed above with reference to FIGS. 1 and 3-7. In an embodiment, the features 902 define a pattern of features that are used to form features of a semiconductor device such as, for example, gate lines of a semiconductor device, interconnect lines of a semiconductor device, active regions (e.g., fins) of a semiconductor device, and/or other suitable features.

In an embodiment, the features 902 include hard mask material. The hard mask compositions may include, for example, suitable silicon or carbon based hard masks. Exemplary compositions include silicon nitride, titanium nitride, silicon carbide, silicon oxide, silicon oxynitride, and/or combinations thereof. In an embodiment, the features 902 are hard mask features formed by suitable lithography methods including forming patterned photoresist features over the hard mask layer and using the patterned photoresist as a masking element, etching the hard mask layer to form features 902.

In another embodiment, the features 902 are photosensitive material (e.g., p or n type photoresist), which has been patterned according to suitable lithography techniques.

The method 800 then proceeds to block 806 where a layer is formed on the substrate using the spray deposition device described above with reference to block 802. In an embodiment, the spray deposition device vaporizes a polymer and solvent mixture and deposits the mixture or solution on the substrate via the spray head. The spray head 204 may receive a polymer/solvent to be vaporized via the fluid line 206 (or lines) as discussed above. In an embodiment, the fluid is supplied to the spray head heated and/or under pressure, thereby allowing the spray head 204 to receive the fluid mixture, vaporize/atomize the fluid, and emit the vaporized fluid toward the target surface in the process chamber 202.

Exemplary compositions of the solvent include propylene glycol monomethyl ether (PEMG), Propylene glycol monomethyl ether acetate (PEMGA), cyclohexanol, ethyl lactate, and combinations thereof. Exemplary polymers include those typical of a photoresist composition or typical of organic hard mask compositions. In an embodiment, the fluid is a diluted organic resist with an accompanying solvent. In one embodiment, the polymer to solvent ratio is 0.1% to 10%. The solution may form a polymer layer as illustrated as conformal layer 904 in FIG. 9. The layer 904 may be substantially similar to thin film 220, described above in FIGS. 1 and 5.

Thus, using the exemplary embodiment of FIG. 9, in an embodiment, the layer 904 is formed on the features 902. The layer 904 may be a polymer. In an embodiment, the polymer is an organic resist polymer. In an embodiment, the layer 904 includes the same polymer as the features 902. In another embodiment, the layer 904 includes a different polymer than the features 902. The polymer layer 904 may be the resultant layer after the solvent is evaporated from the substrate (e.g., during a heating process as discussed below). In an embodiment, the layer 904 has a thickness of between approximately 10 Angstroms and approximately 90 Angstroms. In an embodiment, the polymer layer 904 smooth outs, or fills in the sharp interior angles of and between the features 902, substantially similar to as shown in FIGS. 6 and 7. For example, the polymer layer 904 through cohesion is applied to the features 902 to fill in tiny spaces or gaps in the features 902.

In an embodiment, a heating process, such as described in block 810 is performed during or just following block 806 and the formation of the polymer layer, such as layer 904. In an embodiment, the heating process may be performed at a temperature range of approximately 100 C to approximately 200 C. In another embodiment, the heating process is omitted until later in the process.

The method 800 then proceeds to block 808 where a trim process is performed. The trim process includes providing a vaporized trim solution onto features of a semiconductor substrate. In one embodiment, the trim process is performed on the polymer layer formed as described above in block 806. The trim process may decrease the width of features disposed on the substrate.

During block 808, a trim solution may be vaporized and deposited on the substrate using the spray head as described above. In an embodiment, block 806 and 808 are performed in-situ. For example, in block 806 a layer, such as layer 904, may be formed and the trim solution subsequently deposited without removal from the chamber. In an embodiment, a bake process is also performed, e.g., after formation of the layer and before the trim process.

The trim solution may include tetramethylammonium hydroxide (TMAH) or other developer. In an embodiment, the trim solution includes a solvent. In an embodiment, the trim solution is a rinse material that has etch selectivity versus the polymer resist or developer-soluble feature.

In an embodiment, the trim solution is a developer and applied to a developer-soluble feature. For example, the features 902 may be photoresist or a developer-soluble hardmask. The trim solution may be a developer such as tetramethylammonium hydroxide (TMAH). Thus, applying the developer as a trim solution reduces the width of the developer soluble features 902 in accordance with as discussed below with reference to FIGS. 9 and 10. In another embodiment, the trim solution includes an acid such as HF that has an etch selectivity to the applied polymer or developer-soluble feature.

Figure 10:
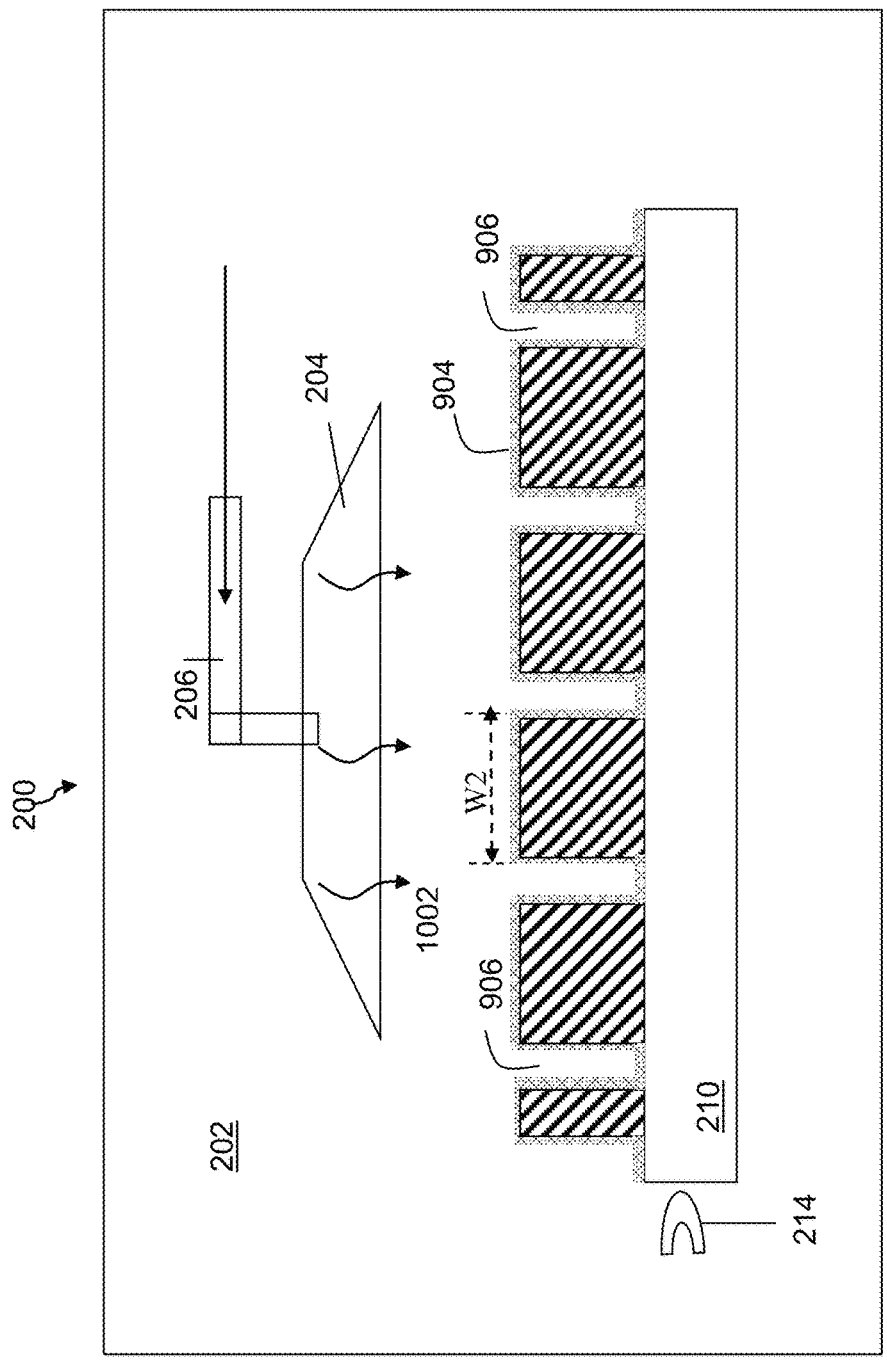

FIG. 10 is illustrative of a vaporized trim solution 1002 applied to the substrate 210. The vaporized trim solution 1002 may include compositions as described above.

In an exemplary embodiment, the trim solution is applied to the substrate by the vapor deposition tool 200 for between approximately 1 and 10 seconds. In an embodiment, the trim process including the application of trim solution 1002 decreases the width of the features (902 and 904) from a width W1 (FIG. 9) to a width W2 (FIG. 10). W1 is less than W2. In an embodiment, the difference between W1 and W2 (W1−W2) is between approximately 25 nanometers (nm) and approximately 500 nm. It is noted that the trim process may be substantially isotropic and reduce the thickness of the lateral regions of the feature to which it is applied as well. In an embodiment, W2 is between approximately 20 and 1000 nm.

In an embodiment, the trim solution removes a portion of the thickness of the polymer layer 904 such that a reduced thickness of the polymer layer 904 remains on the features 902. One example of this is illustrated in FIG. 10.

Figure 11:
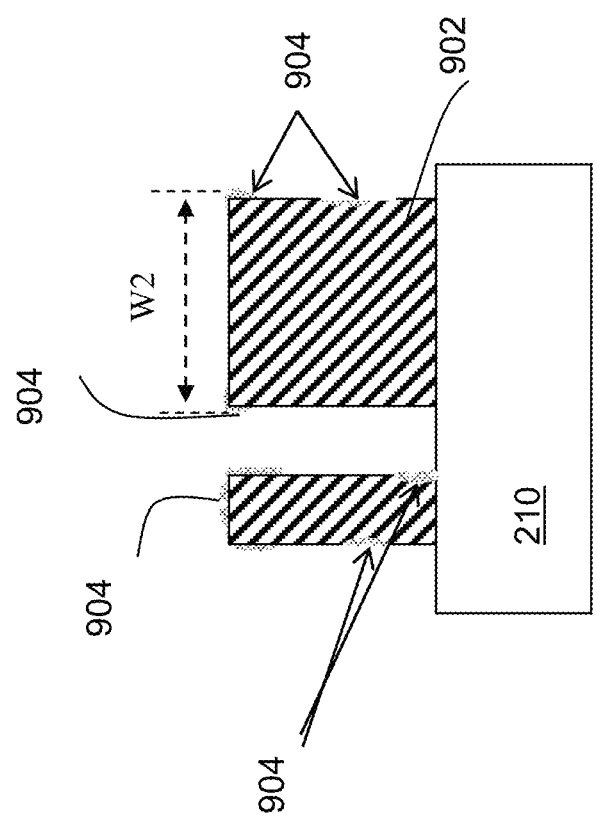
FIG. 11 is illustrative of another embodiment of a substrate at a different stage in a trim process.

In another embodiment, the trim solution removes substantially all of the polymer layer 904. However, residual amounts of the polymer layer 904 may remain filling gaps and holes and smoothing corners of the features 902. This is illustrated in FIG. 11, which illustrates residual polymer 904 filling voids in the features 902 and rounding the corners of the features 902. The placement of the residual polymer 904 is exemplary only and not intended to be limiting beyond as specifically recited in any claim that follows this description.

The method 800 then proceeds to block 810 where a bake process is performed. In an embodiment, the bake process may be performed at a temperature range of approximately 100 C to approximately 200 C.

The method may then continue to further steps including using the features having width W2 as a masking element in etching underlying layers. In an embodiment, the features having width W2 define features of a semiconductor device such as gates, interconnect lines, fin structures of a fin-type field effect transistor (finFET), and/or other suitable features.

In another embodiment of the method 800, the trim process may be performed directly on the features 902 (e.g., photoresist or hardmask). For example, block 806 may be omitted. Thus, the solution 1002 is applied directly to the features 902 and the feature 902 width is decreased. In a further embodiment, a bake process may be performed after the trim solution is applied.

As should be understood from the foregoing, an embodiment of a vaporizing spray deposition device for forming a thin film includes a processing chamber, a fluid line, and a spray head coupled to the fluid line proximate the processing chamber. The fluid line is configured to transfer a polymer fluid and solvent mixture to the spray head. The spray head is configured to receive the polymer fluid and solvent mixture and to atomize the polymer fluid and solvent mixture to emit it in a substantially vaporized form to be deposited on a surface and thereby forming a thin film of the polymer on the surface after evaporation of the solvent.

In another embodiment provided herein, a photoresist spray deposition system includes a processing chamber, a fluid line, a spray head coupled to the fluid line proximate the processing chamber, and a heating device in the processing chamber. The fluid line is configured to transfer a photoresist fluid spray head is configured to receive the photoresist fluid from the fluid line and atomize the photoresist fluid to emit it in a substantially vaporized form. The heating device is configured to provide a hard bake process to a semiconductor wafer receiving the photoresist fluid.

In yet another embodiment, the present disclosure provides a method of applying a thin film to a semiconductor wafer surface. The method includes providing a vaporizing spray deposition system and providing a semiconductor device wafer. The method further includes placing the semiconductor device wafer in proximity of an atomizing spray head on the vaporizing spray deposition system. Additionally, the method includes atomizing a polymer/solvent solution toward the semiconductor device wafer, thereby depositing the solution on the semiconductor device wafer.

The vaporizing deposition systems and methods described herein provide many advantages over conventional systems, a few of which include the following:
  providing a smooth polymer surface on a semiconductor device due to polymer cohesion that inherently fills traditional tiny polymer surface voids;
  improving traditional line edge/width roughness;
  improving traditional pinched peak space in MEEP process;
  providing a substantially uniform conformal resist thickness available for implant processing;
  lower cost processing when compared to atomic layer deposition (ALD) processing; and
  reducing contamination to the coating.

These and other features and advantages should be apparent to those having ordinary skill in the art.

Accordingly, the present disclosure provides a vaporizing polymer spray deposition system and method. While the system and method have been disclosed showing certain features, the present disclosure may benefit any semiconductor process now known or developed in the future. While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

The invention claimed is:

1. A method of semiconductor device fabrication, the method comprising:
    placing a substrate having a first and second features disposed thereon in a vaporizing spray deposition system;
    using an atomizing spray head of the vaporizing spray deposition system, depositing a conformal polymer layer on the first and second features, wherein the first feature having the layer of the polymer disposed thereon has a first width; and
    applying a spray trim process to the first and second features having the polymer layer disposed thereon, wherein the spray trim process includes:
        using the atomizing spray head to deposit a solution on the plurality of features having the layer of polymer, and
        wherein the solution removes a portion of the layer of the polymer forming a reduced polymer layer, thereby providing the first feature having the reduced polymer layer disposed thereon has a second width, less than the first width.

2. The method of claim 1, wherein the feature having the reduced polymer layer has substantially linear sidewalls.

3. The method of claim 1, wherein a difference between the second width and the first width is between approximately 50 nanometers (nm) and approximately 500 nm.

4. The method of claim 1, further comprising:
    performing a hard bake process of the substrate having the spray trim process.

5. The method of claim 1, the first and second feature comprise one of hard mask and photoresist.

6. The method of claim 1, wherein the solution of the trim process includes tetramethylammonium hydroxide (TMAH).

7. The method of claim 1, wherein depositing the conformal polymer layer on the first and second features includes depositing a polymer of a photoresist.

8. The method of claim 1, wherein depositing the conformal polymer layer on the first and second features includes depositing a polymer of an organic hard mask.

9. The method of claim 1, further comprising:
    performing the hard bake process in the vaporizing spray deposition system.

10. The method of claim 1, wherein the solution removes the portion of the layer of the polymer such that a portion of a sidewall of the first feature is exposed.

11. A method, comprising:
    providing a semiconductor wafer having a plurality of hard mask features extending from the substrate;
    placing the semiconductor wafer in proximity of an atomizing spray head of a vaporizing spray deposition system;
    using the atomizing spray head to deposit a thin film of polymer on the plurality of hard mask features including on a top surface and sidewalls of each of the plurality of hard mask features;
    performing a hard bake process using a heating element of the vaporizing spray deposition system; and
    depositing a solution using the atomizing spray head in the same chamber to perform a trim process, wherein the solution includes a composition having an etch selectivity to the thin film of polymer.

12. The method of claim 11, wherein thin film of polymer fills cavities of the plurality of hard mask features.

13. The method of claim 11, wherein the plurality of hard mask features have sharp corners that are rounded by the deposition of thin film of polymer.

14. The method of claim 11, wherein the thin film of polymer is less than 100 Angstroms.

15. The method of claim 11, wherein the depositing the depositing the solution includes depositing tetramethylammonium hydroxide (TMAH).

16. The method of claim 15, wherein the depositing the solution to perform the trim process reduces a thickness of thin film polymer by isotropically etching the thin film polymer.

17. A method, comprising:
    placing a semiconductor wafer in proximity of an atomizing spray head of a vaporizing spray deposition system;
    using the atomizing spray head to deposit a thin film of polymer on a plurality of features including on a top surface and sidewalls of each of the plurality of features;
    performing a trim process using the atomizing spray head on the thin film of polymer to isotropically reduce its thickness.

18. The method of claim 17, wherein the performing the trim process removes the thin film of polymer from a portion of the sidewalls of the plurality of features while maintaining the thin film of polymer in a cavity in a sidewall of one of the plurality of features.

19. The method of claim 17, wherein the performing the trim process provides for a maintaining a first thickness of the thin film polymer on the sidewalls of the plurality of features.

20. The method of claim 17, wherein the trim process includes depositing tetramethylammonium hydroxide (TMAH).

* * * * *